United States Patent [19]

Gondusky et al.

[11] Patent Number: 5,050,040
[45] Date of Patent: Sep. 17, 1991

[54] COMPOSITE MATERIAL, A HEAT-DISSIPATING MEMBER USING THE MATERIAL IN A CIRCUIT SYSTEM, THE CIRCUIT SYSTEM

[75] Inventors: Joseph M. Gondusky, Warwick, R.I.; Henry F. Breit, Attleboro; Karen A. Auguston, Brigthon, both of Mass.

[73] Assignee: Texas Instruments Incorporated, Dallas, Tex.

[21] Appl. No.: 520,291

[22] Filed: May 7, 1990

Related U.S. Application Data

[62] Division of Ser. No. 260,970, Oct. 21, 1988.

[51] Int. Cl.$^5$ .............................................. H05K 7/20
[52] U.S. Cl. ...................... 361/388; 165/185; 174/252; 357/81; 361/400; 428/614
[58] Field of Search .............. 428/614; 174/16.3, 252; 357/81; 165/80.3, 185; 361/382, 383, 386–388, 400, 403, 401, 405

[56] References Cited

U.S. PATENT DOCUMENTS

| | | | |
|---|---|---|---|
| 3,399,332 | 8/1968 | Savolainen | 357/81 |
| 4,401,728 | 8/1983 | Larker | 428/614 |
| 4,472,762 | 9/1984 | Spineli | 361/386 |
| 4,711,804 | 12/1987 | Burgess | 361/383 |
| 4,811,166 | 3/1989 | Alvarez | 361/386 |
| 4,885,214 | 12/1989 | Trenkler | 428/614 |
| 4,894,293 | 1/1990 | Breit | 428/614 |

Primary Examiner—Gerald P. Tolin
Attorney, Agent, or Firm—James P. McAndrews; John A. Haug; Melvin Sharp

[57] ABSTRACT

A novel composite metal material comprises a ferrous metal of relatively low thermal expansion properties and a silver metal substantially free of ferrous constituents having a relatively high thermal conductivity which cooperate in a novel way to provide the composite material with an effective thermal expansion coefficient corresponding to that of various silicon or gallium arsenide semiconductor devices and the like for reliably mounting the devices while also providing paths of high conductivity silver metal extending through the composite material to provide improved heat-dissipation from the semiconductor devices. A circuit system mounts a semiconductor device using the novel composite metal material alone, bonded to other support materials, or formed into a selected shape. In one preferred embodiment, the composite material is used in a novel heat-dissipating member having components of different shape which are bonded together. One component formed of the novel composite material has a selected shape for compactly mounting the semiconductor device and the second component is formed of high thermal conductivity metal and has a different shape particularly adapted to receive heat from the silver paths and to facilitate heat-dissipation from the member.

6 Claims, 5 Drawing Sheets

COMPOSITE MATERIAL, A HEAT-DISSIPATING MEMBER USING THE MATERIAL IN A CIRCUIT SYSTEM, THE CIRCUIT SYSTEM

This application is a division of U.S. Ser. No. 07/260,970, Oct. 21, 1988.

BACKGROUND OF THE INVENTION

The field of this invention is that of electronic circuit systems incorporating semiconductor devices and the invention relates more particularly to novel systems having improved means for reliably mounting semiconductor devices while also providing improved heat-dissipation from the devices.

This is a division of the commonly assigned, copending application, Ser. No. 260,970, of the same title of the present applicants filed Oct. 21, 1988. Related subject matter is disclosed in commonly assigned copending Patent Applications Ser. No. 166,300 entitled A COMPOSITE MATERIAL AND METHOD OF MAKING, now U.S. Pat. No. 4,885,214; Ser. No. 166,290 entitled A CIRCUIT SYSTEM, A COMPOSITE METAL MATERIAL FOR USE THEREIN, AND A METHOD FOR MAKING THE MATERIAL, now U.S. Pat. No. 4,894,293; and Ser. No. 247,799, entitled A MEMBER OF REFRACTORY METAL MATERIAL OF SELECTED SHAPE AND METHOD OF MAKING.

Semiconductor devices such as integrated circuit chips typically embody materials of relatively low thermal expansion properties so that when the devices are mounted on a substrate and when device terminals are electrically connected to circuit paths on the substrate to form a circuit system, it is difficult to maintain reliable mounting and electrical connection of the devices in the system while also effectively dissipating the heat generated in the devices during circuit operation. Where materials of high thermal conductivity have been employed to improve heat-dissipation, it has frequently been found that differences in thermal expansion between the semiconductor devices and such materials have tended to subject the device mountings and connections to thermal stress resulting in loss of mounting and connection reliability. On the other hand, where materials of low expansion properties have been employed to improve mounting and connection reliability, heat-dissipation from the devices has tended to be so restricted that the operating characteristics and service lives of the devices have been somewhat limited and the devices have been subject to parametric shifts. Many different substrate materials or mounting means have been proposed for improving heat-dissipation while maintaining suitable reliability but each has tended to be subject to deficiencies for some applications. For example, multilayer sheet materials embodying layers of metal of relatively low expansion properties metallurgically bonded to layers of metal of relatively high thermal conductivity are found suitable for use in many circuit substrates but are sometimes found to have heat-dissipation properties which are too limited for some applications. Some substrate materials embodying wire mesh or discrete elements of low expansion metal or the like disposed in a high thermal conductivity matrix of copper or aluminum have also been proposed for some applications but have tended to be relatively expensive to manufacture with the desired thermal conductivity properties. Other composite metal members adapted for mounting semiconductor devices have also been provided with selected shapes for improving heat-dissipation from the members. However, it would be desirable to provide novel heat-dissipating members, and circuits incorporating such members as well as materials for use in the members and novel methods for making the members and materials, to provide improved heat-dissipation and improved reliability of mounting and connection for semiconductor devices in such circuit systems.

SUMMARY OF THE INVENTION

It is an object of this invention to provide a novel and improved composite metal material for use in mounting silicon and gallium arsenide semiconductor devices and the like in a circuit system; to provide such composite materials which are easily platable and which are malleable and easily formed by rolling and the like in relatively large sheet sizes and the like; to provide a novel circuit system incorporating semiconductor devices mounted on such composite materials; to provide novel and improved heat-dissipating members; to provide such members using such composite materials for mounting semiconductor devices in such systems with improved reliability; to provide such novel and improved composite metal materials comprising low expansion ferrous metals combined with a high conductivity silver metal substantially free of ferrous constituents and to provide such heat-dissipating members having components of different shape selected and bonded together, preferably but bit necessarily by metallurgical bonds, for providing improved heat-dissipation and mounting reliability for semiconductor devices.

Briefly described, the novel and improved composite metal material of the invention has a ferrous metal of relatively very low thermal expansion coefficient combined with a silver metal material of relatively very high thermal conductivity which is substantially free of ferrous constituents therein, the combined materials cooperating in a novel way for providing the composite material with a relatively low effective coefficient of thermal expansion substantially corresponding to that of silicon or gallium arsenide semiconductor devices or the like to be mounted thereon while also providing paths of high conductivity silver metal material extending through the composite material. In one preferred embodiment of the novel composite material, a continuous matrix of the low expansion ferrous metal material has a multiplicity of pores extending through the matrix filled with the silver metal material of said relatively high thermal conductivity, the silver metal being characterized by low solubility of the ferrous constituents therein to be easily and economically formed as a malleable, platable material cooperating with the low expansion ferrous material while retaining its desirably high thermal conductivity; in an alternate preferred embodiment of the invention, a plurality of discrete elements of low expansion ferrous metal material are dispersed in a continuous matrix of the silver metal material. In a preferred embodiment of the improved circuit system of this invention, at least one heat-dissipating member preferably has one metal component formed of the noted composite metal material of a shape selected for compactly accommodating a semiconductor device thereon and has a second metal component of another, different shape particularly selected for providing improved dissipation of heat from the member, the components being bonded together in efficient heat-transfer relation to each other along an interface between the components.

The novel and improved composite metal material of the invention is made by combining the noted low expansion ferrous metal material with the noted silver metal material while the silver metal material is heated for melting the silver metal sufficiently to securely bond the silver metal to the ferrous metal for forming a composite metal material of desirably high density. In one preferred embodiment for making the improved composite metal material, particles of powders of the noted ferrous metal materials are heated to a relatively high selected temperature while the ferrous powder particles are pressed together for diffusion bonding or sintering the ferrous metal particles to each other to form a continuous but highly porous matrix of the ferrous metal material. A silver metal material is then mounted and introduced into the pores of the ferrous metal material for filling the pores and bonding the silver metal to the ferrous metal material to provide paths of high thermal conductivity silver metal extending through the composite material. In an alternate preferred embodiment for making the novel composite metal material, particles of powders of the ferrous and silver metal materials are mixed together and are heated for bonding the powder particles together. In one method the heating is regulated for diffusion bonding the particles to each other. In an alternate method the particles are heated to a selected temperature at which at least the surfaces of the silver metal particles are melted for bonding to each other and to the particles of ferrous material. The bonded materials are then cooled and formed in any convenient manner. In a desirable method, the bonded powder materials are subjected to rolling reduction in thickness or other mechanical working before final forming to improve the thermal conductivity and expansion properties of the composite metal material. In each of the noted methods, the substantial insolubility of the ferrous metal materials in the mounted silver metal assures that the silver metal material remains substantially free of ferrous constituents to retain its high thermal conductivity in the composite material. If desired a small inclusion of nickel in the silver material is found to improve wettability of the silver material relative to the ferrous material.

In the method for making the novel and improved heat-dissipating member of the invention, a layer or component of the above-noted composite metal material is bonded by soldering, brazing, epoxying, use of thermally conductive adhesives, or by roll-bonding, pressing or in other conventional manner to a layer of another metal, preferably of low cost and higher thermal conductivity, the first component of the member of the composite metal material being provided or formed by machining or the like in one selected shape for compactly mounting a semiconductor device thereon and the second component of the member of said other metal material being provided or formed by machining or the like in another different selected shape which is particularly adapted for dissipating heat. In one preferred embodiment, the component materials are joined by economical solid phase metallurgical bonding for efficient heat-transfer between the components.

In that arrangement, the novel and improved composite metal material is easily and economically formed in any desired sheet sizes, pads or the like. The composite material is easily and economically formed or plated and is easily incorporated in the novel and improved heat-dissipating member for example. However it is also adapted to provide improved reliability of mounting and electrical connection for silicon semiconductor devices and the like thereon while also providing for improved withdrawal of heat from the semiconductor device, whereby the semiconductor device is adapted to display improved operating characteristics over a long service life. The selected shapes of the components of the heat-dissipating member economize on space and material for mounting the semiconductor device while further facilitating heat transfer to the second member component and heat-dissipation from that member through the second component. In that way, novel and improved electrical circuit systems are provided incorporating such semiconductor devices.

DESCRIPTION OF THE DRAWINGS

Other objects, advantages and details of the systems, members, and materials appear in the following detailed description of preferred embodiments of the invention, the detailed description referring to the drawings in which.

DESCRIPTION OF PREFERRED EMBODIMENTS

Figure 1:
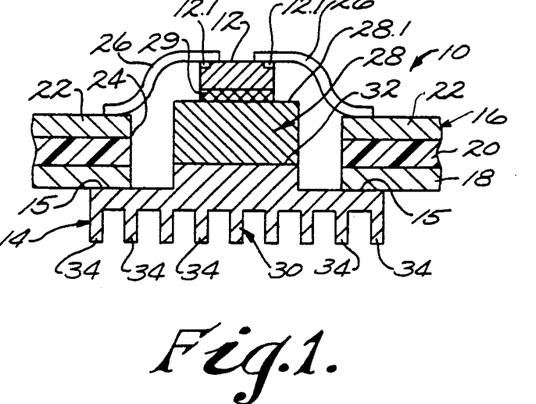
FIG. 1 is a partial section view along a vertical axis of a preferred embodiment of the novel circuit system of this invention incorporating the novel heat-dissipating member of the invention.

Referring to the drawings, 10 in FIG. 1 indicates a preferred embodiment of the novel and improved electrical circuit system of this invention which is shown to include a semiconductor device 12 such as a conventional integrated circuit chip or the like mounted on the novel and improved heat-dissipating member 14 of the invention for reliably mounting the semiconductor device in the circuit system while also providing improved heat-dissipation from the device during circuit operation. Preferably for example, the circuit system includes a substrate 16 having a layer 18 of a metal such as copper or aluminum or the like of high thermal conductivity having an electrically insulating coating 20 of an organic polymer material or the like secured to the layer 18 and supporting electrically conductive circuit paths 22 formed on the coating in any conventional manner. The substrate preferably has an opening 24 accommodating the heat-dissipating member 14 therein and edge portions of the member as indicated at 15 in FIG. 1 are secured in heat-transfer relation to the substrate 16 by solder (not shown) or in other conventional manner. Typically the semiconductor device 12 comprises a silicon material or the like of relatively low coefficient of thermal expansion, and terminals of the device as indicated at 12.1 (only in FIG. 1) are electrically connected to the circuit paths 22 by soldering or wire-bonding or in other conventional manner as indicated at 26 in FIG. 1. The layer 18 and the circuit paths 22 are formed of composite metals or any other comparable materials if preferred within the scope of this invention. The insulating layer 20 is also formed of inorganic material such as a ceramic coating or the like or comprises a metal-filled or ceramic-filled insulating material having improved thermal conductivity or the like, within the scope of this invention if preferred for specific applications.

Figure 2:
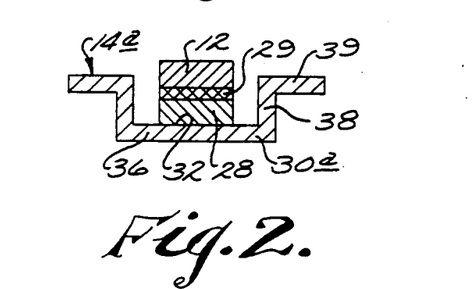
FIG. 2 is a partial section view similar to FIG. 1 illustrating an alternate preferred embodiment of the heat-dissipating member of the invention.

In a preferred embodiment, the heat-dissipating member 14 preferably comprises a first component 28 of a first selected pad shape or the like having a surface portion 28.1 adapted for compactly receiving the semiconductor device 12 thereon. The semiconductor device is mounted on that first component surface by use of a solder or epoxy adhesive or the like or in any other conventional manner as indicated at 29, the selected mounting serving to secure the device to the component in electrically connected or electrically insulated relation as may be preferred. Preferably the first component 28 comprises a material of relatively low coefficient of thermal expansion substantially corresponding to the coefficient of expansion of the semiconductor device for reliably mounting the device on the component and also provides suitably high thermal conductivity properties for rapidly withdrawing heat from the semiconductor device. In the preferred embodiment, the heat-dissipating member 14 also comprises a second metal component 30 which is metallurgically bonded to the first component along an interface 32 in efficient heat-transfer relation to the first component, the second component having another, different selected shape which is particularly adapted for dissipating heat from the member. Preferably for example, the second component has a shape including a plurality of fins 34 extending from the member to facilitate heat-dissipation from the member. In an alternate embodiment 14a of the heat-dissipating member of this invention as shown in FIG. 2 (wherein the same or comparable reference numerals are used as appropriate), the second component has a cup shape including a bottom 36, a side wall 38, and a flange 39, and the first component 28 is metallurgically bonded as at 32 to the cup bottom inside the cup.

Figure 3:
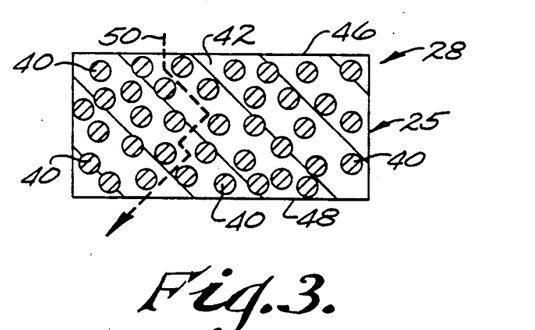
FIG. 3 is a section view to enlarged scale through a component of the heat-dissipating member shown in FIG. 1 illustrating a preferred embodiment of the novel and improved composite metal material of the invention.
Figure 4:
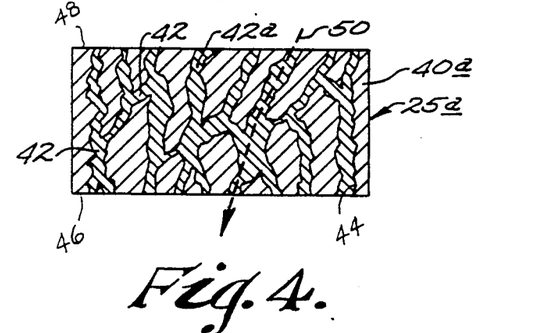
FIG. 4 is a section view similar to FIG. 3 illustrating an alternate preferred embodiment of the composite metal material of the invention.

In the novel heat-dissipating member of the invention, the first component 28 of the member 14 comprises any of the various conventional composite metal materials having a desired low coefficient of thermal expansion and a desired high thermal conductivity within the scope of this invention. However in a preferred embodiment, the first component 28 comprises the novel and improved composite metal material 25 of this invention as shown in FIGS. 3 and 4. That is, the component 28 preferably comprises an iron or ferrous material of selected thermal conductivity and of relatively low coefficient of thermal expansion which is combined with a silver metal material of selected thermal expansion coefficient and of relatively high thermal conductivity which is substantially free of ferrous constituents, the ferrous and silver metal materials being combined in selected ratio for providing the composite metal material with an effective coefficient of thermal expansion substantially corresponding to that of the semiconductor device 12 while also providing paths of the silver metal extending through the composite metal material for rapidly conducting heat away from the semiconductor device.

In one embodiment of the invention as illustrated in FIG. 3, the novel composite metal material of the invention embodied in the component 28 comprises a plurality of discrete elements 40 of a ferrous metal alloy or the like of relatively low coefficient of thermal expansion dispersed in a continuous matrix of a silver metal material 42 of relatively high thermal conductivity, the silver metal being substantially free of iron or other constituents which might significantly limit or restrict the thermal conductivity of the metal material. Although the component 28 as shown embodies several layers of the discrete elements 40 between opposite component surfaces 46 and 48, the component 28 is preferably relatively thin in preferred embodiments of this invention. In another preferred embodiment of the composite material of the invention as shown in component 25a illustrated in FIG. 4, a porous matrix 40a of a ferrous metal alloy of relatively low coefficient of thermal expansion has a multiplicity of pores 44 which extend through the composite material between opposite sides 46 and 48 of the composite material, the pores being filled with the noted silver metal material of high thermal conductivity which is bonded to the ferrous metal in the composite material. In each embodiment, the silver metal forms paths of high thermal conductivity between opposite sides of the composite metal as indicated by arrows 50 in FIGS. 3 and 4. In a preferred embodiment, the silver metal forms a second continuous matrix as indicated in FIG. 4. In preferred embodiments of the invention, the ferrous metal material 40 comprises a metal of relatively very low coefficient of thermal expansion selected from the group consisting of alloys having nominal compositions by weight of about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum and the balance iron, of about 57 percent cobalt, 9 percent chromium and the balance iron, and of about 23 to 30 percent nickel, about 17 to 30 percent cobalt, about 0.6 to 0.8 percent manganese and the balance iron. The silver metal material 42 preferably comprises substantially pure silver metal, preferably embodying up to about 0.5 weight percent nickel to improve its wetting characteristics, but any silver metal alloy of high thermal conductivity substantially free of ferrous or other constituents which might significantly reduce thermal conductivity of the silver metal are also used within the scope of this invention.

Figure 9:
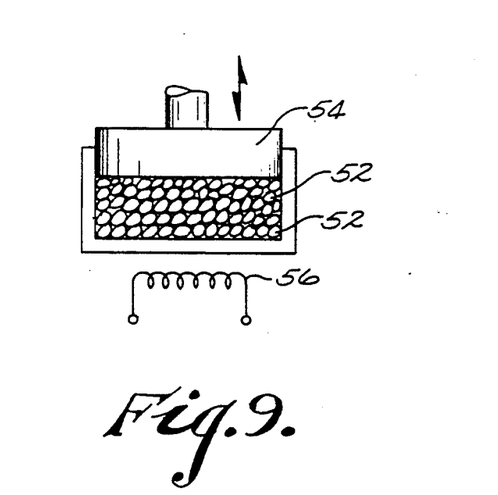
FIG. 9 is a diagrammatic view illustrating a step in one preferred embodiment for making the novel composite metal material of the invention.
Figure 10:
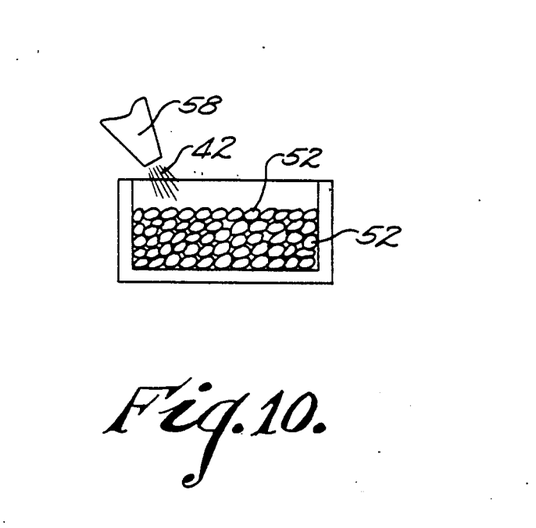
FIG. 10 is a diagrammatic view illustrating another step in the method shown in FIG. 9.

In one method for making the novel composite metal material as shown in FIG. 9, discrete particles 52 of the ferrous metal material are preferably provided with particle sizes in the range from 44 to 425 microns diameter and are compressed as indicated diagrammatically at 54 while the compressed particles are heated as indicated at 56 to a temperature on the order of about 1000° to 1300° C. for a period of time for about 30 to 200 minutes for sintering the particles together to form a continuous matrix of the ferrous metal having a multiplicity of pores extending between opposite sides of the matrix. Molten silver metal preferably with the noted nickel additive for improved wetting is then introduced into the pores of the ferrous matrix from a suitable supply as indicated at 58 in FIG. 10 for filling the pores and bonding the silver metal to the ferrous material to form a composite material of high density as shown in FIG. 4. In an alternate embodiment of the invention, particles of the ferrous material and particles of the silver metal of comparable size are mixed together and compressed in a similar way and are heated to a selected temperature for diffusion bonding the particles to each other. In an alternate method the mixed and compressed particles are heated to a relatively lower temperature on the order of 960° C. for a brief period such as a few minutes for melting at least surface portions of the silver metal particles to bond them to each other and to the ferrous metal particles for forming a continuous silver matrix having the discrete ferrous particles dispersed therein. The volume ratio of the ferrous metal and silver metal in these embodiments is regulated to provide the composite material with a selected effective relatively low coefficient of thermal expansion in the range from about 1.4 to 9 PPM/C.° and with a selected relatively high thermal conductivity in the range from about 0.28 to 5.6 watt/inch/C.°.

EXAMPLE A

In one embodiment of the invention, particles of the ferrous metal alloy designated Invar having a nominal composition by weight of 36 percent nickel and the balance iron are combined and thoroughly mixed with particles of silver metal. The particle sizes are in the ranges as noted above, and the particles are then compressed and are heated to a temperature on the order of 960° C. for a few minutes for melting at least surface portions of the silver metal particles to bond those particles to each other and to the ferrous metal particles to form a substantially fully dense composite material. The substantial insolubility of the ferrous metal in the silver metal serves to assure that the silver metal material retains its high thermal conductivity after forming the composite material. Where the metal materials of the composite are combined in a 50/50 volume ratio, the composite material displays a relatively low effective coefficient of thermal expansion of about 10.2 PPM/C.°. While also displaying a relatively high effective thermal conductivity of about 5.6 watt/inch/C.°.

EXAMPLE B

In another preferred embodiment, particles of the noted Invar material of the size noted above are compressed under light pressure and heated to a temperature of about 1300° C. for a period of about two hours in an inert or reducing atmosphere for sintering the ferrous metal particles to each other to form a highly porous ferrous metal matrix. Silver metal melted at 960° C. is then introduced into the pores of the ferrous material for forming a composite metal material comparable to that of Example A. Preferably the silver metal incorporates about 0.5 weight percent nickel to improve wetting of the Invar. Where the volume ratio of silver to ferrous material is 50/50 as in Example A, comparable characteristics are achieved; where the volume ratio is about 20 silver to 80 ferrous material, thermal expansion of about 3.4 PPM/C.° are achieved with thermal conductivity of about 2.3 watt/inch/C.°; and where the volume ratio is about 10 silver to 90 ferrous material, thermal expansion of about 2.0 PPM/C.° is achieved with thermal conductivity of about 1.3 watt/inch/C.°.

Figure 11:
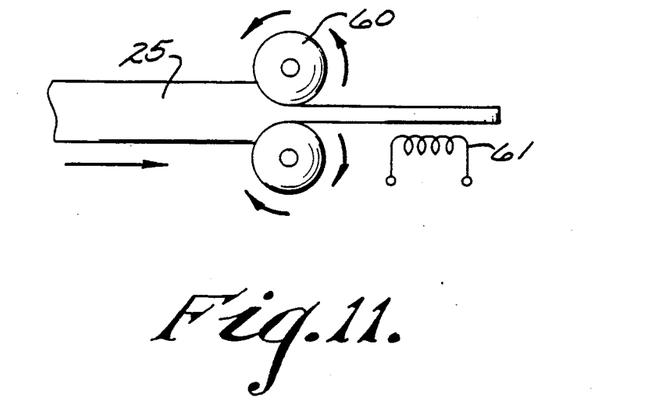
FIG. 11 is a diagrammatic view illustrating a further step in the method shown in FIG. 10.

In a preferred embodiment, composite metal material formed as above described is desirably subjected to rolling reduction in thickness or other mechanical working, preferably cold working, as diagrammatically indicated at 60 in FIG. 11 in any conventional manner which is found to lower the thermal expansion coefficient of the composite material, possibly due to the cold working of the ferrous metal material in the composite and to increase effective thermal conductivity of the composite.

Figure 12:
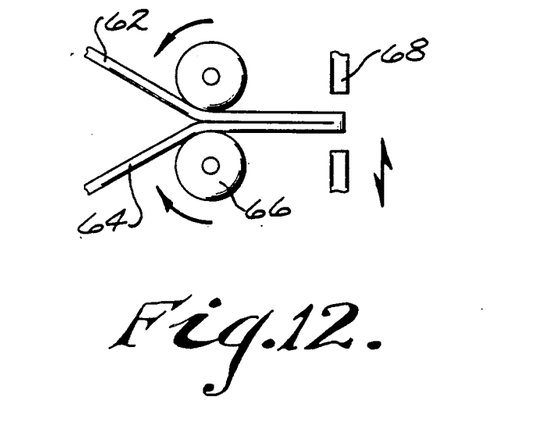
FIGS. 12-13 are diagrammatic views illustrating steps in a preferred embodiment of the method for making the novel heat-dissipating member of this invention.
Figure 13:
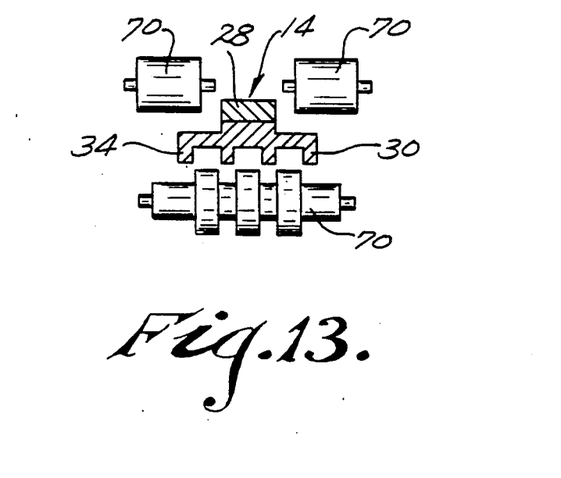

In accordance with the invention, a strip 62 of the composite metal material 25 is then metallurgically bonded to a strip 64 of another lower cost metal material of high thermal conductivity such as aluminum or copper or the like by roll bonding or any other conventional manner as indicated diagrammatically at 66 in FIG. 12. A strip of that bonded metal material is then cut off as indicated at 68 in FIG. 12 and is machined or otherwise formed in any conventional manner for providing the heat-dissipating member 14 as above described. That is, as shown diagrammatically in FIG. 13 for example, both sides of the strip of bonded metal material are preferably machined as indicated diagrammatically at 70 in FIG. 13 for forming the heat-dissipating member 14, the composite metal material of the strip 62 forming the first component of the member of one selected shape for compactly receiving a semiconductor device thereon and the aluminum or other high thermal conductivity material of the strip 64 forming the second component 30 of the member 14 having a different shape including the fins 34 as indicated in FIG. 13 for facilitating heat-dissipation from the member.

Figure 5A:
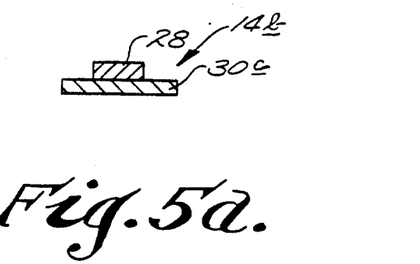
FIGS. 5A-B, 6A-D, 7A-D and 8 illustrate alternate uses and embodiments of the heat-dissipating members and composite metal materials of the invention.
Figure 5B:
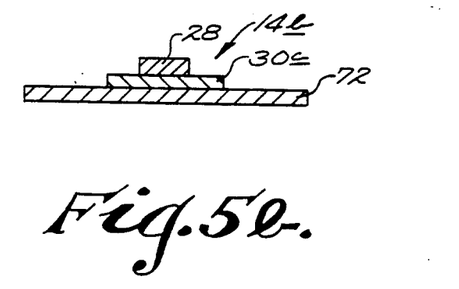
Figure 6A:
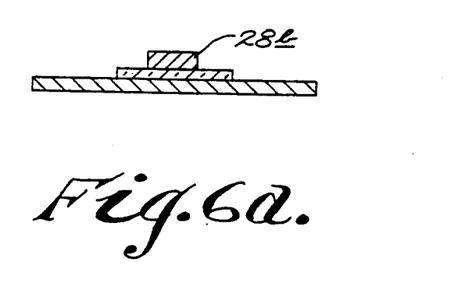
Figure 6B:
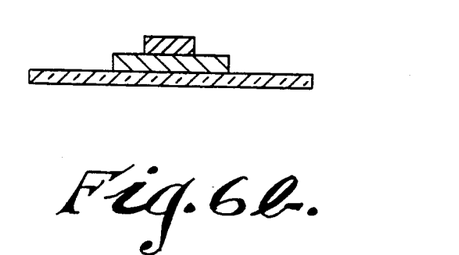
Figure 6C:
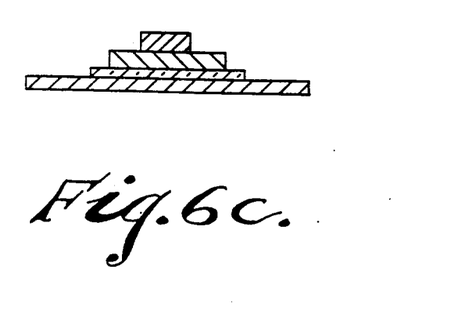
Figure 6D:
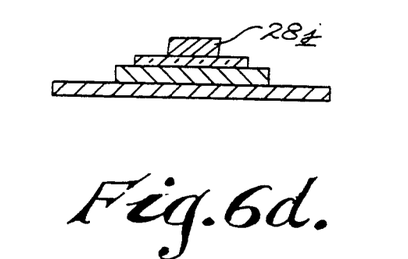
Figure 7A:
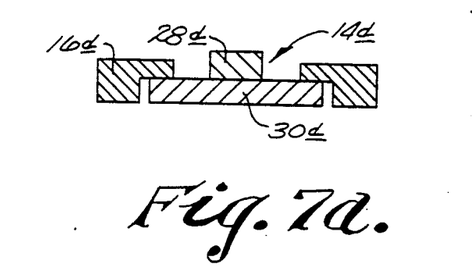
Figure 7B:
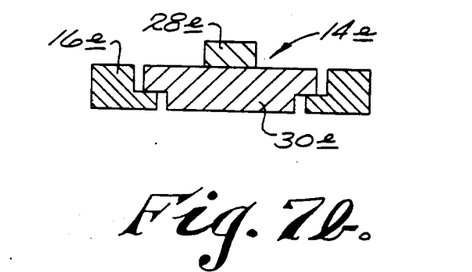
Figure 7C:
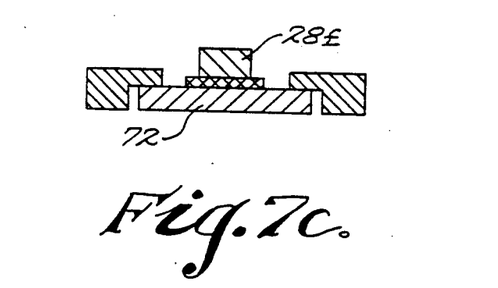
Figure 7D:
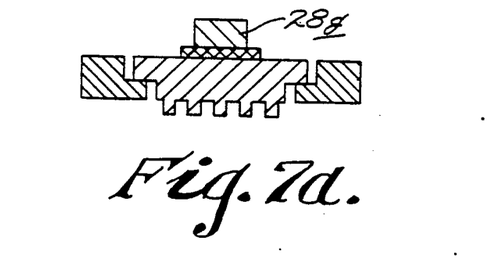
Figure 8:
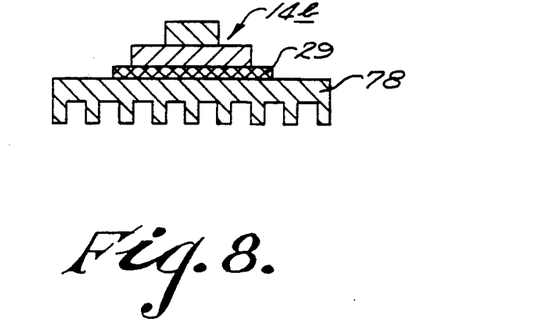

As will be understood various modifications of the disclosed embodiments of the invention are possible within the scope of the invention as indicated in FIG. 2 and in FIGS. 5A-B, 6A-D, 7A-D and 8, wherein comparable features are identified with comparable reference numerals. Thus, a pad 28 of the composite material 25 is metallurgically bonded to a cup 30a of aluminum or the like by pressing in any convention manner for forming the member 14a as shown in FIG. 2. Such a pad 28 can also be bonded to an aluminum metal strip 30c for forming a member 14b as indicated in FIG. 5A. If desired, the member 14b is further bonded to an additional aluminum support 72 as indicated in FIG. 5B. Various alternate configurations of the heat-dissipating member 14d, 14e are mounted on various substrates 16d, 16e as indicated in FIGS. 7A to 7B respectively. Alternately pads 28e and 28f of the composite metal material are mounted on components of higher conductivity metal by use of electrically insulating epoxy layers 29 as indicated in FIGS. 7C and 7D respectfully. Similarly, pads of the composite material 28h, 28j are attached to supports 72 or 74 by use of epoxy layers 29 as indicated in FIGS. 6A and 6D respectfully while heat-dissipating members 14b are mounted on comparable supports of insulating material 76 or conductive material 72 by use of other epoxy layers 29 as indicated in FIGS. 6B and 6C respectfully. A heat-dissipating 14b is alternately mounted on a shaped support 78 as shown in FIG. 8.

It should be understood that although preferred embodiments of the invention have been described by way of illustrating the invention, the invention includes all modifications and equivalents of the disclosed embodiments following within the scope of the appended claims.

We claim:

1. A circuit system comprising a substrate supporting circuit paths means thereon, a semiconductor device having selected terminals and having a selected coefficient of thermal expansion, means connecting at least some of said terminals to at least some of said circuit path means, and a heat-dissipating member mounting the semiconductor device in the system, the member having a first component with a coefficient of thermal expansion in the range from about 1.4 to 10.2 ppm/°C., with a first selected shape having a surface compactly and reliably mounting the semiconductor device thereon, and having an opposite surface, the member having a second component with a second selected shape differing from the first selected shape particularly adapted for dissipating heat therefrom, the second component having one surface metallurgically bonded in heat-transfer relation to the opposite surface of the first component to receive heat from the semiconductor device transferred through the first component, the second component having sufficient thermal conductivity and having a plurality of heat dissipating means projecting from an opposite surface of the second component such that heat is dissipated from the semiconductor device to permit reliable operation of the device.

2. A circuit system as set forth in claim 1 wherein the material of the first component comprises a composite metal material having a ferrous metal material of selected thermal conductivity and relatively low coefficient of thermal expansion combined with a silver metal material of selected coefficient of thermal expansion and relatively high thermal conductivity which is substantially free of ferrous metal constituents therein, the ferrous and silver metal materials being bonded together and cooperating to provide the opposite metal material with an effective coefficient of thermal expansion closely matched to that of the semiconductor device while having select paths of the silver metal material extending through the composite metal material providing the composite metal material with an effective thermal conductivity relatively higher than that of the ferrous metal material.

3. A circuit system according to claim 2 wherein the ferrous metal material of the first component of the member forms a continuous porous matrix and the silver metal material is disposed within pores in the ferrous metal matrix for forming said paths of said high conductivity silver metal material extending between opposite sides of the composite metal material.

4. A circuit system according to claim 3 wherein the ferrous metal material of the first component of the member is selected from the group of alloys having nominal compositions by weight of about 36 to 50 percent nickel and the balance iron; of about 31 percent nickel, 8 percent chromium, 8 percent cobalt and the balance iron; of about 32 percent nickel, 15 percent cobalt, 1 percent molybdenum and the balance iron; of about 38 percent nickel, 7 percent chromium and the balance iron; of about 17 percent chromium and the balance iron; of about 16.5 percent chromium, 4.5 percent aluminum, and the balance iron; of about 57 percent cobalt, 9 percent chromium and the balance iron; and of about 23 to 30 percent nickel, about 17 to 30 percent cobalt, about 0.6 to 0.8 percent manganese, and the balance iron; for cooperating with the silver metal material to provide the composite metal material with an effective coefficient of thermal expansion relatively much lower than that of the silver metal material.

5. A circuit system according to claim 2 wherein the silver metal material of the first component of the member comprises a continuous matrix having a plurality of discrete elements of the ferrous metal material secured in dispersed relation therein.

6. A circuit system according to claim 5 wherein the ferrous metal material of the first component of the member is selected from the group of alloys having nominal compositions by weight of about 36 to 50 percent nickel and the balance iron; of about 31 percent nickel, 8 percent chromium, 8 percent cobalt and the balance iron; of about 32 percent nickel, 15 percent cobalt, 1 percent molybdenum and the balance iron; of about 38 percent nickel, 7 percent chromium and the balance iron; of about 17 percent chromium and the balance iron; of about 16.5 percent chromium, 4.5 percent aluminum, and the balance iron; of about 57 percent cobalt, 9 percent chromium and the balance iron; and of about 23 to about 30 percent nickel, about 17 to about 30 percent cobalt, about 0.6 to 0.8 percent manganese, and the balance iron; for cooperating with the silver metal material to provide the composite metal material with an effective coefficient of thermal expansion relatively much lower than that of the silver metal material.

* * * * *